United States Patent
Kwan et al.

(10) Patent No.: US 7,303,109 B2
(45) Date of Patent: Dec. 4, 2007

(54) STUD BUMPING APPARATUS

(75) Inventors: Ka Shing Kwan, Singapore (SG); Guoshen Hu, Singapore (SG); Tingyu He, Singapore (SG); Yie Mi, Singapore (SG); Yam Mo Wong, Singapore (SG)

(73) Assignee: ASM Technology Singapore Pte Ltd., Singapore (SG)

( * ) Notice: Subject to any disclaimer, the term of this patent is extended or adjusted under 35 U.S.C. 154(b) by 0 days.

(21) Appl. No.: 10/612,383

(22) Filed: Jul. 1, 2003

(65) Prior Publication Data

US 2005/0001018 A1    Jan. 6, 2005

(51) Int. Cl.
*B23K 1/06* (2006.01)
*B23K 37/04* (2006.01)

(52) U.S. Cl. .................. 228/1.1; 228/4.5; 228/42; 228/47.1

(58) Field of Classification Search .............. 228/47.1, 228/231, 4.1, 2.1, 59, 222, 214; 438/613
See application file for complete search history.

(56) References Cited

U.S. PATENT DOCUMENTS

| | | | |
|---|---|---|---|
| 4,890,780 A | * | 1/1990 | Mimata et al. .............. 228/4.5 |
| 5,222,014 A | * | 6/1993 | Lin .............................. 361/792 |
| 5,758,817 A | * | 6/1998 | Chapman ..................... 228/264 |
| 6,766,817 B2 | | 7/2004 | da Silva ......................... 137/1 |
| 6,861,771 B2 | * | 3/2005 | Zhai et al. ..................... 310/12 |
| 6,866,182 B2 | * | 3/2005 | Wong et al. ................. 228/219 |

FOREIGN PATENT DOCUMENTS

| | | | |
|---|---|---|---|
| DE | 3429375 | * | 12/1985 |
| JP | 01-296636 | * | 11/1989 |

* cited by examiner

*Primary Examiner*—Kiley Stoner
(74) *Attorney, Agent, or Firm*—Ostrolenk, Faber, Gerb & Soffen, LLP

(57) ABSTRACT

The invention provides an apparatus and a method for forming conductive bumps on a plurality of semiconductor devices with an oxidizable material. The apparatus comprises a bump forming device, a chamber system adapted to house the semiconductor devices and a gas supply for supplying an inert gas into the chamber system. A support table is provided for supporting the semiconductor devices during bumping, and the said support table is operative to move the semiconductor devices from a bumping site into the chamber system after bumping.

12 Claims, 4 Drawing Sheets

STUD BUMPING APPARATUS

FIELD OF THE INVENTION

The invention relates to an apparatus usable in the stud bumping of semiconductor wafers to form conductive terminals on the wafer, and in particular, to stud bumping of wafers mechanically with material that is prone to oxidation, such as copper.

BACKGROUND AND PRIOR ART

Flip chip microelectronic assembly is already established in the semiconductor industry. The assembly process involves the direct electrical connection of face-down electronic components onto substrates, circuit boards or carriers by means of conductive bumps on the chip bond pads. In contrast, older technology involves wire bonding of each bond pad of face-up chips to substrates, circuit boards or carriers. The advantages of flip chip packaging over older technology include smaller size, better performance, increased flexibility, reliability and lower cost. For example, eliminating packages and bond wires reduces the required board area by up to 95%, and requires far less height. Weight can be less than 5% of packaged device weight. In fact, the flip chip can be even smaller than Chip Scale Packages (CSP) because its size is the size of a chip. Flip chip materials are also becoming more widely available, further lowering production costs.

A conductive bump serves several functions in the flip chip assembly. Electrically, the bump provides a conductive path from chip to substrate. The bump also provides a thermally conductive path to carry heat from the chip to the substrate. In addition, the bump provides part of the mechanical mounting of the chip to the substrate. Finally, the bump provides a spacer, preventing electrical contact between the chip and substrate conductors, and acting as a short lead to relieve mechanical strain between board and substrate.

There are several ways of forming bumps on semiconductor wafers. These include solder bumping, plating and stud bumping. The present invention relates to stud bumping, which bumps wafer dice by a wire bonding technique that is modified from the older wire bonding technology. This technique makes a ball for wire bonding by melting the end of a wire to form a sphere. The ball is attached to the chip bond pad as the first part of a wire bond. To form bumps instead of wire bonds, wire bonders are modified to break off the wire after attaching the ball to the chip bond pad. The ball, or "stud bump" remaining on the bond pad provides a permanent connection to the underlying metal on the chip.

Traditionally, gold wire is used in stud bumping. However, there has recently been increased interest in using copper wire instead. Copper bumps have been found to offer increased reliability, extended temperature range, greater mechanical strength, higher connection density, improved manufacturability, and better electrical and heat-dissipating performance. Nevertheless, a challenge faced in copper stud bumping is that copper reacts with oxygen and oxidizes at the high temperatures that stud bumping processes are carried out. The formation of copper oxide, which is non-conductive, result in defects in the final product, and this needs to be avoided as far as possible. It would thus be desirable to have access to an apparatus that allows copper stud bumping to be performed at a high temperature while reducing the risk of oxidation of the copper bumps.

SUMMARY OF THE INVENTION

It is therefore an object of the invention to seek to provide an improved apparatus which reduces exposure of stud bumps to oxygen in the atmosphere during a stud bumping process with material that is prone to oxidation so as to minimize oxidation of the bumps.

According to a first aspect of the invention, there is provided an apparatus for forming conductive bumps on a plurality of semiconductor devices with an oxidizable material, comprising: a bump forming device; a chamber system adapted to house the semiconductor devices; a gas supply for supplying an inert gas into the chamber system-; and a support table for supporting the semiconductor devices during bumping, said support table being operative to move the semiconductor devices from a bumping site into the chamber system after bumping.

According to a second aspect of the invention, there is provided a method for forming conductive bumps on a plurality of semiconductor devices with an oxidizable material, comprising the steps of: providing a support table for supporting the semiconductor devices; forming bumps on the semiconductor devices on the support table at a bumping site; and moving the semiconductor devices from the bumping site into a chamber system after bumping while supplying an inert gas into the chamber system.

It would be convenient hereinafter to describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

An example of an apparatus and method in accordance with the invention will now be described with reference to the accompanying drawings, in which.

DETAILED DESCRIPTION OF THE PREFERRED EMBODIMENT

Figure 1:
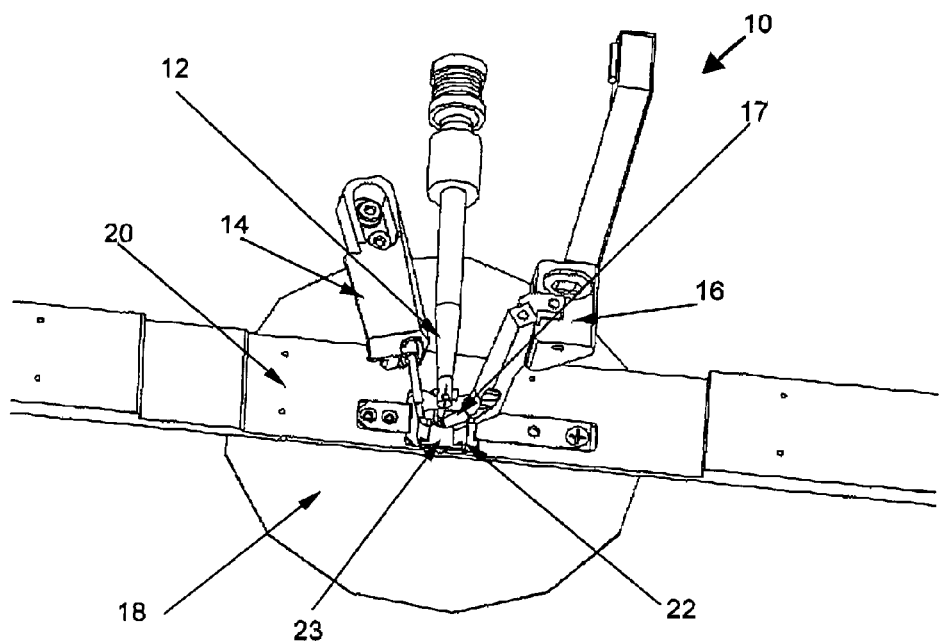
FIG. 1 is a plan view of a bumping assembly located over a wafer array including an oxidation reduction device positioned adjacent the bumping assembly for reducing oxidation while bumping.

FIG. 1 is a plan view of a bumping assembly 10 that is usable for stud bumping located over a plurality of semiconductor devices, such as that comprised in a wafer array

18. A bump forming device in the form of a bonding horn 12 of an ultrasonic transducer wire bonder that includes a capillary at its end creates ball bumps on the surface of dice that form the wafer array 18 at a bumping site 23. An electrical discharge electrode 14 is positioned next to the bonding horn 12 and capillary to provide electrical sparks to form the ball bumps. Since wire which is prone to oxidation at typical bumping temperatures—in this case copper wire— is used for bumping, an oxidation reduction device 16 with an inert gas nozzle 17 is positioned adjacent the bonding horn 12 to blow an inert gas such as nitrogen or argon gas (or a combination of nitrogen and hydrogen gas) to the bumping site 23 for reducing oxidation of the copper ball bumps that are formed.

A fixed shroud 20 with a detachable window cover 22 covers a portion of the wafer 18 and is positioned around the bumping site 23 for covering one or more bumped semiconductor devices. The detachable window cover 22 can be changed to offer a different opening size based on the area of the bumping site 23 that is required. The detachable window cover 22 is usually made of regular metal, but may be made of a porous metal material if it is desired to generate a supply of the inert gas through the body of the cover 22. It is preferable that the shroud 20 also has nozzles or outlets blowing inert gas onto the wafer 18 and particularly the bumping site 23, to further reduce the risk of oxidation.

Figure 2:
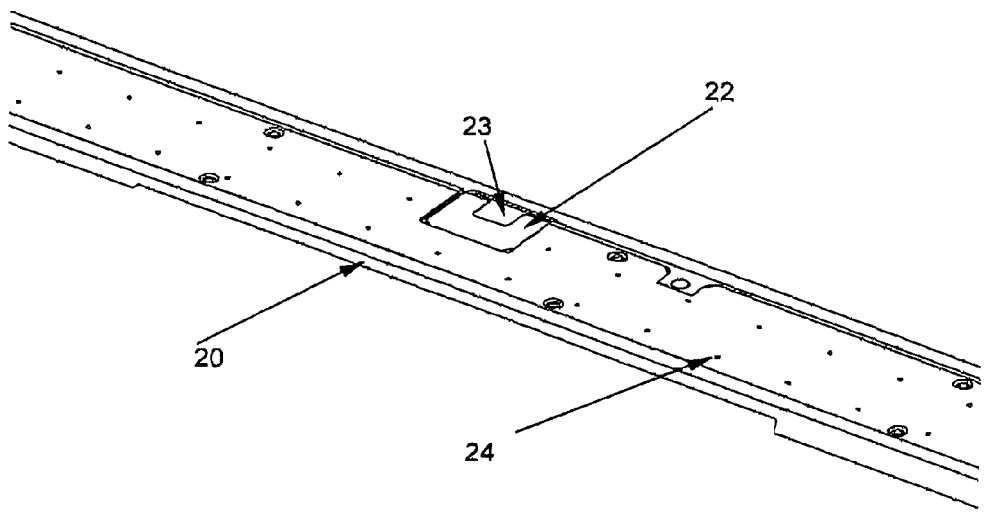
FIG. 2 is an isometric view of a shroud with a detachable window cover to protect surrounding dice from oxidation during bumping by the bumping assembly.

FIG. 2 is an isometric view of a shroud 20 with a detachable window cover 22 to protect surrounding dice on the wafer 18 from oxidation during bumping by the bumping assembly 10. As mentioned above, it is preferable that the shroud 20 include a number of gas nozzles 24 on its bottom surface to continuously introduce the inert gas onto the surface of the wafer 18 during bumping to further reduce the risk of oxidation of bumped dice located away from the bumping site 23.

Figure 3:
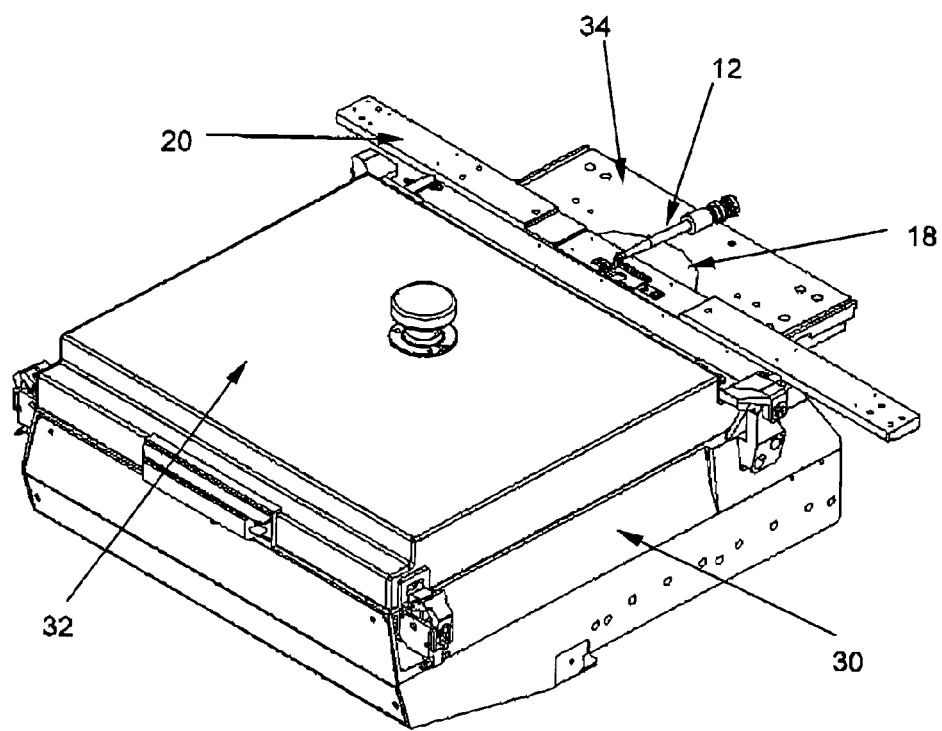
FIG. 3 is an isometric view of an apparatus according to the preferred embodiment of the invention including a chamber system looking from one end of the chamber system.

FIG. 3 is an isometric view of an apparatus according to the preferred embodiment of the invention including a chamber system looking from one end of the chamber system. The chamber system comprises an outer chamber 30 and an inner chamber 40 that is houseable within the outer chamber 30 (see FIG. 5). The outer chamber 30 is enclosed on three sides, with one open side that enables a support table, which may be in the form of a wafer table 34, to slide into and out of the outer chamber 30. The outer chamber 30 has a top cover 32 which can be opened to enable access to its contents.

The wafer table 34 is designed to support and hold a wafer array 18 in a relatively fixed position to allow bumping by the bonding horn 12 to be carried out. In this embodiment, bumping is carried out at a bumping site 23 adjacent to an opening of and just outside the confines of the outer chamber 30. The wafer table 34 is operative to move the semiconductor devices of the wafer array 18 from the bumping site 23 into the chamber system after bumping. The shroud 20 is fixed together with the bumping assembly 10 just outside the opening of the outer chamber 30 such that its detachable window 22 is located at the bumping site 23 where dice are to be bumped. Thus, the wafer 18 generally moves relative to the bumping assembly 10 and shroud 20, which maintain relatively fixed positions. The wafer table 18 includes a heater block (not shown) and a detachable top plate 35 (see FIG. 6) attached on top of the heater block.

Figure 4:
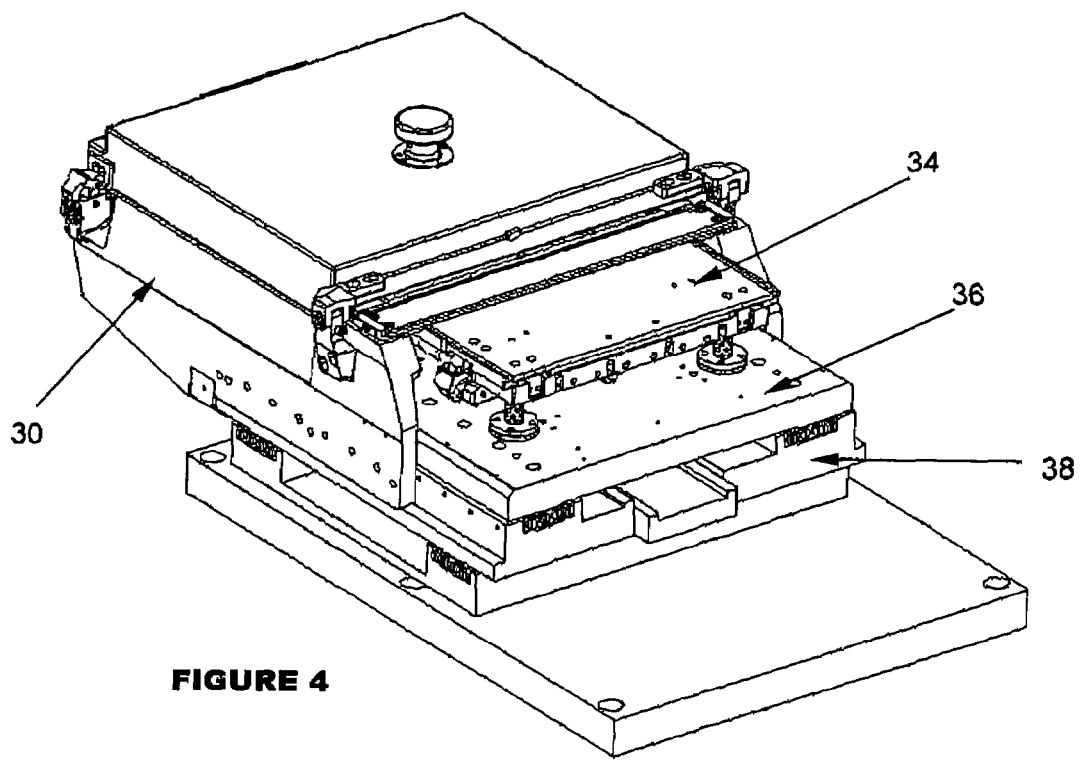
FIG. 4 is an isometric view of the apparatus looking from an opposite end of the chamber system of FIG. 3.

FIG. 4 is an isometric view of the apparatus looking from an opposite end of the chamber system of FIG. 3. The wafer table 34 carrying the wafer 18 is slidable into and out of the outer chamber 30. To control the positions of the wafer table 34 and thus the wafer 18 relative to the bumping assembly 10, the wafer table and outer chamber 30 of the chamber system may be coupled to a positioning device, preferably an XY table. The wafer table 34 may be coupled to a Y stage 36 of the XY table whereas the outer chamber 30 may be coupled to an X stage 38 of the XY table. Since the wafer table 34 is slidable with respect to the outer chamber 30 in the Y direction along a first axis, the Y stage 36 may determine the extent to which the wafer table 34 is retracted into the outer chamber 30. This, together with movement of the X stage 38 along a second axis perpendicular to the first axis, allows access by the relatively fixed bumping assembly 10 to every semiconductor device on the wafer 18.

A typical stud bumping process may now be described. The process starts with the wafer table 34 in an open position so that the whole wafer is exposed. The wafer table 34 is heated to a temperature of between 200° C. and 300° C. to prepare the wafer 18 for bumping. The Y and X stages 36, 38 of the XY table position the wafer table 34 and outer chamber 30 respectively such that the bumping assembly 10 and window cover 22 defining the bumping site 23 are located over an innermost semiconductor device on the wafer array 18, that is, the portion of the wafer 18 nearest the outer chamber 30. The Y position of the wafer 18 is then fixed, and the wafer 18 is moved in the X direction to bump a row of dice in sequence. The bumping assembly 10 conducts copper stud bumping or bonding on the wafer surface. During bumping, the oxidation reduction device 16 blows an inert gas to the bumping site 23 to protect the copper balls formed from oxidation. Gas nozzles 24 under the fixed shroud 20 also blow the inert gas to and beyond the bumping site 23 to protect the bumped studs both under the shroud 20 and inside the bumping site 23.

After a row of dice at a Y position has been bumped, that row of dice on the wafer table 34 is moved into the outer chamber 30 (and inner chamber 40) to protect them from the atmosphere. The next row of dice in the next Y position is then bumped in sequence by movement in the X direction. This process will be continued until all rows of dice in the wafer array 18 are bumped. The whole wafer 18 is then slid into the outer chamber 30 (and inner chamber 40). The gas supply for continuously supplying an inert gas into the inner chamber 40 of the chamber system is required as the wafer 18 is still hot and the finished copper studs should not be exposed to oxygen.

Figure 5:
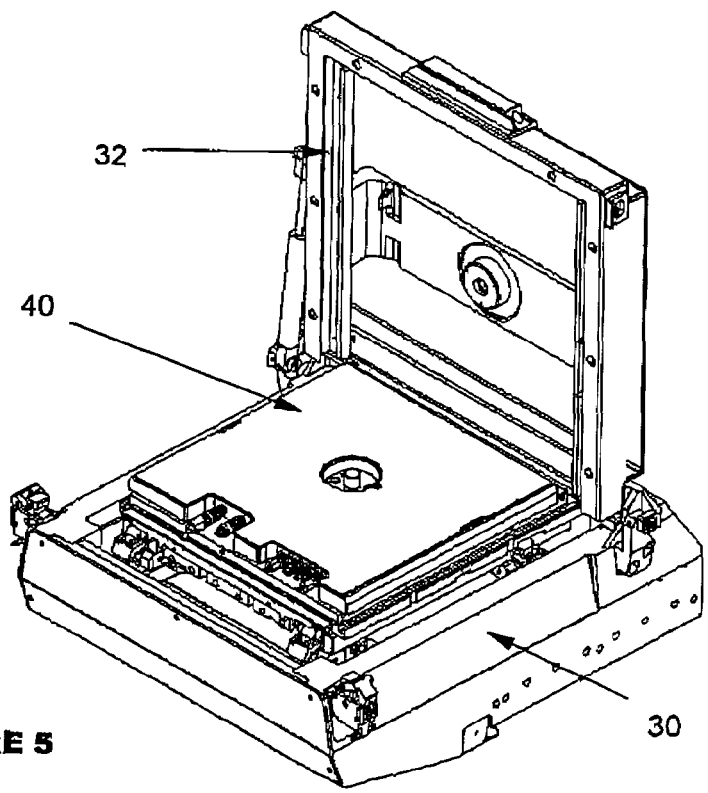
FIG. 5 is an isometric view of the apparatus of FIGS. 3 and 4 with an open outer chamber cover revealing a removable inner chamber.

FIG. 5 is an isometric view of the apparatus of FIGS. 3 and 4 with an open outer chamber cover 32 revealing a removable inner chamber 40. The inner chamber 40 is removable from the outer chamber 30 and another inner chamber may be put in its place for conducting stud bumping on another wafer. The usefulness of the removable inner chamber 40 lies in the fact that the wafers 18 are heated to high temperatures during bumping, and therefore, the copper stud bumps on the wafer 18 are still susceptible to oxidation until the wafer 18 cools sufficiently. Containing the wafer 18 inside an enclosed inner chamber 40 prevents exposure of the wafer 18 to the atmosphere until it has cooled sufficiently. The removal of the inner chamber 40 allows another wafer to be bumped while a completed wafer 18 is allowed time to cool.

The inner chamber 40 may be inserted into or removed from the outer chamber 30 either manually or automatically. Whilst it may be removable by opening the outer chamber cover 32 first, it may also be removable by sliding it out of the open end of the outer chamber 30 without opening the outer chamber cover 32.

Figure 6:
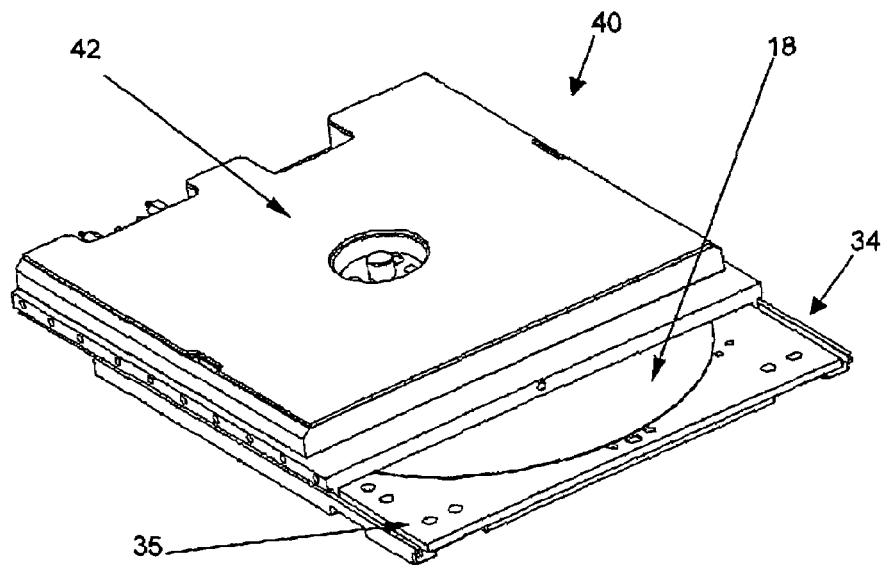
FIG. 6 is an isometric view of the removable inner chamber that has been removed from the outer chamber.

FIG. 6 is an isometric view of the removable inner chamber 40 that has been removed from the outer chamber 30. The inner chamber 40 includes an inner chamber cover 42 with a bracket that allows the wafer table 34 to slide relative to it. The wafer table 34, together with the inner chamber cover 42, respectively form an enclosure for the wafer 18 when the wafer table 34 is fully retracted. The wafer table 34 may be fully extended to expose the whole of the wafer 18 for bumping, or fully retracted to protect the heated wafer 18 from oxygen in the atmosphere. The removable part of the inner chamber 40 comprises the inner chamber cover 42 and top plate 35 (not including the heater block) of the wafer table 34 for forming an enclosure around bumped semiconductor devices of the wafer array 18.

Furthermore, in a preferred embodiment, the inner chamber cover 42 has a number of gas nozzles on its inside surface to blow an inert gas into the inner chamber 40 onto the wafer 18 when the wafer table 34 is retracted. Preferably, the inner chamber cover 42 also has a recessed portion on its inside surface to enable the inner chamber cover 42 to be dropped on top of the top plate 35 before the inner chamber 40 is removed from the outer chamber, such that the wafer 18 can be set inside the recessed portion for closer protection.

Figure 7:
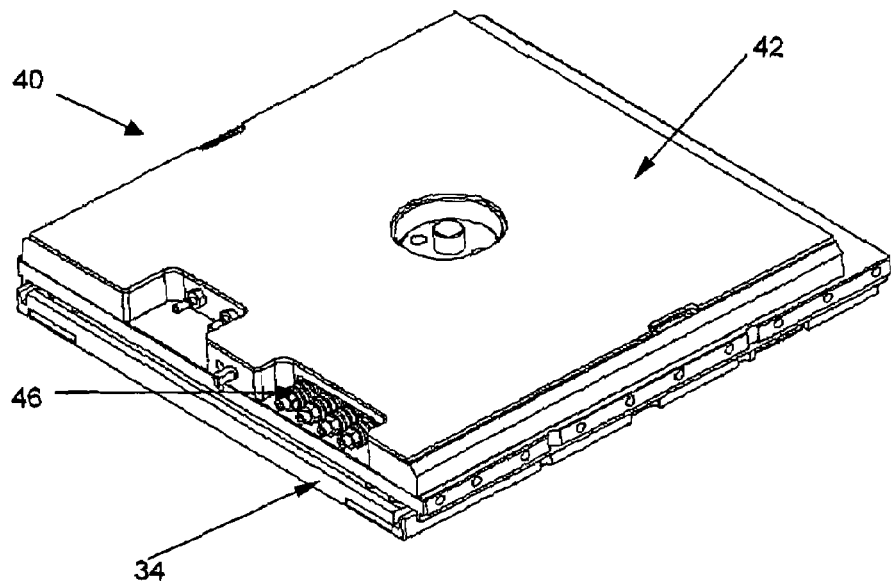
FIG. 7 is an isometric view of the removable inner chamber from an opposite end to that of FIG. 6 illustrating its detachable tubing connectors.

FIG. 7 is an isometric view of the removable inner chamber 40 from an opposite end to that of FIG. 6 illustrating its detachable gas tubing connectors 46. These connectors 46 are designed to receive detachable tubing (not shown) that are attached to outside gas sources and detachably connectable to the inner chamber 40 to introduce an inert gas into the inner chamber 40 during bumping. As mentioned, the reason is so that stud bumps that have been formed do not oxidize while inside the inner chamber 40. Therefore, there are preferably internal tunnels (not shown) in the inner chamber cover 42 to direct the inert gas to gas nozzles on the inside surface of the inner chamber cover 42. The detachable tubing may be disconnected from an inner chamber 40 once bumping of a wafer 18 inside it has been completed, allowing the inner chamber 40 to be removed from the outer chamber 30. Another inner chamber with another wafer may be put into the outer chamber 30, and the tubing connected to the new inner chamber.

It should be appreciated that the described embodiment of the invention provides oxidation prevention for copper stud bumping or bonding during the whole process from stud bumping to finished wafer transferring. The apparatus can cater for wafers 18 of different diameter and is relatively easy to operate, thereby promoting flexibility and savings in cost. By moving the chamber system together with an XY table, a relatively compact apparatus can be obtained. Therefore, a relatively smaller amount of inert gas is required for the more compact apparatus. Further, machine idling time is minimized because no time is needed to cool down the finished wafer or the heater bock before removing it from the machine. The finished wafer can be removed from the outer chamber 30 immediately after stud bumping is completed, and another wafer can be processed.

The invention described herein is susceptible to variations, modifications and/or additions other than those specifically described and it is to be understood that the invention includes all such variations, modifications and/or additions which fall within the spirit and scope of the above description.

The invention claimed is:

1. Apparatus for forming conductive bumps on a plurality of semiconductor devices with an oxidizable material, comprising:
   a chamber system adapted to house the semiconductor devices, the chamber system having an access opening;
   a bump forming device located at a bumping site at which the semiconductor devices are positioned during bumping, the bumping site being situated so that the semiconductor devices are entirely outside the chamber system and adjacent to the access opening during bumping;
   a gas supply for supplying an inert gas into the chamber system; and
   a support table for supporting the semiconductor devices during bumping,
   wherein the support table is receivable into the chamber system through the access opening, and is operative to move the semiconductor devices from the bumping site into the chamber system after bump formation.

2. Apparatus as claimed in claim 1, including an oxidation reduction device for introducing a supply of inert gas to the bumping site.

3. Apparatus as claimed in claim 1, including a shroud positioned around the bumping site for covering one or more bumped semiconductor devices.

4. Apparatus as claimed in claim 3, wherein the shroud includes nozzles for introducing a supply of inert gas onto the semiconductor devices.

5. Apparatus as claimed in claim 1, wherein the chamber system comprises an outer chamber, and an inner chamber that is houseable within the outer chamber.

6. Apparatus as claimed in claim 5, wherein the inner chamber is removable from the outer chamber.

7. Apparatus as claimed in claim 6, wherein the removable inner chamber comprises at least a portion of the support table and an inner chamber cover for forming an enclosure around bumped semiconductor devices.

8. Apparatus as claimed in claim 6, including gas tubings that are detachably connectable to the inner chamber for bringing an inert gas into the inner chamber from an external source.

9. Apparatus as claimed in claim 1, wherein the support table is coupled to a positioning device that is operative to move the support table along a first axis.

10. Apparatus as claimed in claim 9, wherein the chamber system is coupled to a positioning device that is operative to move the chamber system along a second axis perpendicular to the first axis.

11. Apparatus as claimed in claim 1, wherein the bump forming device is an ultrasonic wire bonder.

12. Apparatus as claimed in claim 1, wherein the semiconductor devices are comprised in a semiconductor wafer and the support table is a wafer table.

* * * * *